(12) United States Patent
Wu

(10) Patent No.: US 9,667,073 B2
(45) Date of Patent: May 30, 2017

(54) CONTROLLING POLARITY IN AN ACTIVE BALANCING SYSTEM FOR A BATTERY

(71) Applicant: Texas Instruments Incorporated, Dallas, TX (US)

(72) Inventor: Jian-Yi Wu, San Ramon, CA (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 242 days.

(21) Appl. No.: 14/497,289

(22) Filed: Sep. 25, 2014

(65) Prior Publication Data
US 2016/0094063 A1 Mar. 31, 2016

(51) Int. Cl.
*H02J 7/00* (2006.01)
*G01R 31/36* (2006.01)

(52) U.S. Cl.
CPC ........ *H02J 7/0014* (2013.01); *G01R 31/3658* (2013.01); *H02J 7/0019* (2013.01)

(58) Field of Classification Search
USPC .......................................................... 320/108
See application file for complete search history.

(56) References Cited

U.S. PATENT DOCUMENTS

| 2008/0191663 A1* | 8/2008 | Fowler | B60L 11/1861 |
| | | | 320/118 |
| 2010/0225275 A1* | 9/2010 | Bucur | H02J 7/0019 |
| | | | 320/116 |
| 2011/0115436 A1* | 5/2011 | Zhang | B60L 11/1861 |
| | | | 320/134 |
| 2011/0267005 A1* | 11/2011 | Gollob | H02J 7/0014 |
| | | | 320/116 |
| 2014/0028263 A1* | 1/2014 | Jo | H02J 7/0016 |
| | | | 320/128 |
| 2014/0062383 A1* | 3/2014 | Yun | H02J 7/0016 |
| | | | 320/103 |
| 2014/0312828 A1* | 10/2014 | Vo | H01M 10/4257 |
| | | | 320/103 |

* cited by examiner

*Primary Examiner* — Samuel Berhanu
*Assistant Examiner* — Tessema Kebede
(74) *Attorney, Agent, or Firm* — Michael A. Davis, Jr.; Charles A. Brill; Frank D. Cimino

(57) ABSTRACT

A device includes a transformer, a controller, and a switch coupled between the transformer and the controller. The transformer has a primary coil and a secondary coil. The controller receives an indication of a metric of a cell of a battery. In response to the indication, the controller outputs a signal to select a polarity of a balancing current for balancing the cell. The switch receives the signal from the controller. In response to the signal, the switch causes the transformer to generate a primary current of a selected polarity through the primary coil. The transformer generates the balancing current through the secondary coil by inductively coupling the primary coil to the secondary coil. The transformer outputs the balancing current having the polarity for balancing the cell.

19 Claims, 10 Drawing Sheets

| SIGNALS | CHARGE | SW1 | SW2 | Φ1 | Φ2 | SW3 | SW4 | Φ3 | Φ4 |
|---|---|---|---|---|---|---|---|---|---|
| H/L LEVEL | H | L | L | L | L | DON'T CARE | DON'T CARE | L | L |
|  | H | L | H | L | H |  |  | L | L |
|  | H | H | L | H | L |  |  | L | L |
|  | H | H | H | L | L |  |  | L | L |
|  | L | DON'T CARE | DON'T CARE | L | L | L | L | L | L |
|  | L |  |  | L | L | L | H | L | H |
|  | L |  |  | L | L | H | L | H | L |
|  | L |  |  | L | L | H | H | L | L |

FIG. 10

PREVENT (Φ1 AND Φ2) OR (Φ3 AND Φ4) FROM SHOOT-THROUGH

CONTROLLING POLARITY IN AN ACTIVE BALANCING SYSTEM FOR A BATTERY

BACKGROUND

The disclosures herein relate in general to electronic circuitry, and in particular to controlling polarity in an active balancing system for a battery.

A modern battery pack often includes multiple battery cells connected in series. The output voltage generated by each individual battery cell in a battery pack typically varies from the output voltages of the other individual battery cells of the battery pack. The amount of such voltage variations is often caused by factors such as manufacturing variations, temperature changes, and other such internal or external factors. The voltage variations also exist between individual battery packs when multiple battery packs are connected in series to form a battery module. Voltage balancing systems are often useful for balancing such individual voltages. However, such balancing systems typically dissipate power, which reduces the amount of stored energy that remains for supplying electrical systems coupled to the multiple battery cells and/or battery packs.

SUMMARY

A device includes a transformer, a controller, and a switch coupled between the transformer and the controller. The transformer has a primary coil and a secondary coil. The controller receives an indication of a metric of a cell of a battery. In response to the indication, the controller outputs a signal to select a polarity of a balancing current for balancing the cell. The switch receives the signal from the controller. In response to the signal, the switch causes the transformer to generate a primary current of a selected polarity through the primary coil. The transformer generates the balancing current through the secondary coil by inductively coupling the primary coil to the secondary coil. The transformer outputs the balancing current having the polarity for balancing the cell.

BRIEF DESCRIPTION OF THE DRAWINGS

FIG. 10 is a logic diagram of logic states of the primary-side polarity switch of FIG. 6.

DETAILED DESCRIPTION

Figure 1:
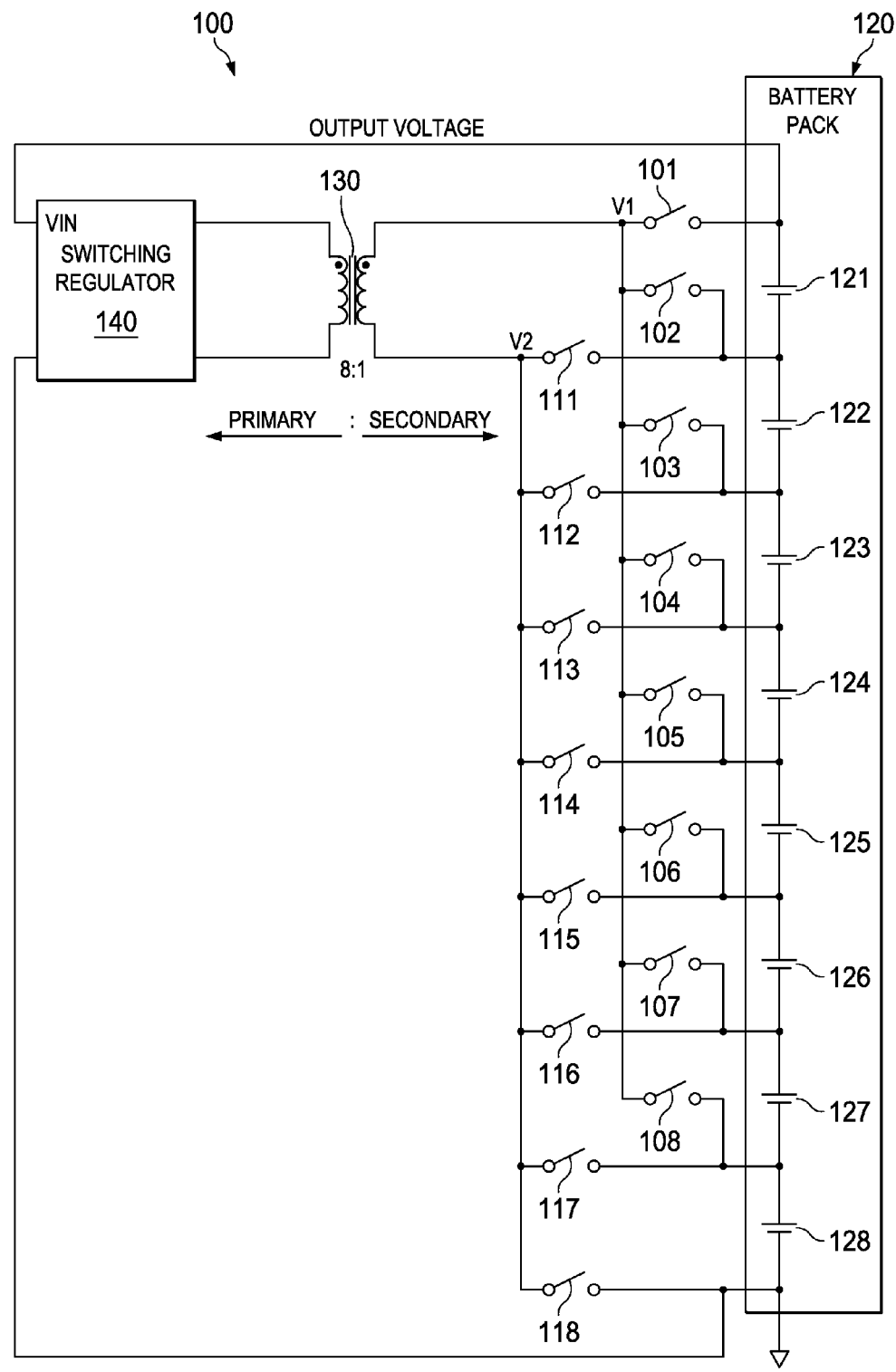
FIG. 1 is a schematic diagram of a conventional switch-array-based active balancing system.

FIG. 1 is a schematic diagram of a conventional switch-array-based active balancing system 100. The system 100 includes a switching regulator 140. The switching regulator 140 is operable to provide power of a fixed polarity for balancing individual cells of a battery pack 120 by selectively applying power to a transformer 130. The transformer 130 transfers the applied power to selected cells of the battery 120.

The system 100 is operable to individually balance (e.g., charge and/or discharge) a selected cell by actuating a selected pair of secondary-side switches associated with the selected cell. By actively balancing individual cells of the battery pack 120 (e.g., with respect to one or more voltages of other cells in the battery pack 120), the battery pack 120 itself is conditioned to provide optimal performance over the lifetime of the battery pack 120.

The battery pack 120 includes multiple cells (e.g., cells 121, 122, 123, 124, 125, 126, 127 and 128), so the battery pack 120 is operable to store and provide power in those cells. Each such cell is a power storage device, such as a chemical "battery cell" where each cell is operable to be charged and discharged. Optionally, each such cell can be a "battery" itself (e.g., having multiple cells). Accordingly, a "unit" can be a cell or a battery pack.

The system 100 is operable to control (e.g., actuate) secondary-side switches (e.g., switches 101, 102, 103, 104, 105, 106, 107, 108, 111, 112, 113, 114, 115, 116, 117 and 118). A first such secondary-side switch is operable to selectively couple a first terminal of a selected cell of battery pack 120 to a first terminal (e.g., tap) of the secondary of the transformer 130. A second such secondary-side switch is operable to selectively couple a second terminal (e.g., that is different from the first battery terminal) of the selected cell battery pack 120 to a second terminal (e.g., that is different from the first transformer terminal) of the secondary of the transformer 130.

Selectively coupling the first and second terminals of a selective cell to the respective terminals of the secondary of the transformer 130 allows the selected cell to be either charged or discharged in accordance with which particular switches are selected. For example, the cell 122 can be (e.g., partially) charged by simultaneously actuating the switches 102 and 112 to create a charging current (not shown) having the direction (e.g., polarity) that is the same as the overall current produced by the battery pack 120. Moreover, the cell 122 can be (e.g., partially) discharged by simultaneously actuating the switch 103 and the switch 111 to create a discharging current (not shown) having a direction that is opposite from the overall current produced by the battery pack 120. Because power is transferred inductively across the transformer 130, the selected switches are typically actuated repeatedly (e.g., repeatedly toggled on and off) to create a change in current that facilitates transference of power across the transformer 130.

In this example, the battery pack 120 includes eight cells. Accordingly, each cell of the battery pack 120 ideally has a voltage that is one-eighth of the nominal voltage of battery pack 120. The transformer 130 has a step-down voltage conversion (e.g., "turns") ratio (e.g., 8:1) that is in accordance with the total number (e.g., sum) of cells in the battery pack 120. Accordingly, the transformer 130 is operable to provide a charging current (or a discharging current) having a voltage that is in accordance with (e.g., around one-eighth of the battery pack 120 total voltage) a nominal voltage of each cell of the battery pack 120.

The switching regulator 140 is operable to couple (and decouple) the battery pack output voltage to the high-side terminal of the primary coil of the transformer 130 (e.g., as indicated by the polarity dot in FIG. 1). For example, the output voltage of the battery pack 120 and the ground line of the battery pack 120 are respectively coupled to the first and second inputs of switching regulator 140.

The system 100 is operable to selectively couple the first and second terminals of a selected cell of the battery pack 120 to the respective terminals of the secondary coils of the transformer 130 by controlling operation of the switches associated with the selected cell. The system 100 is operable to determine whether to apply a balancing (e.g., charging or a discharging) current to the selected cell, for example.

Figure 2:
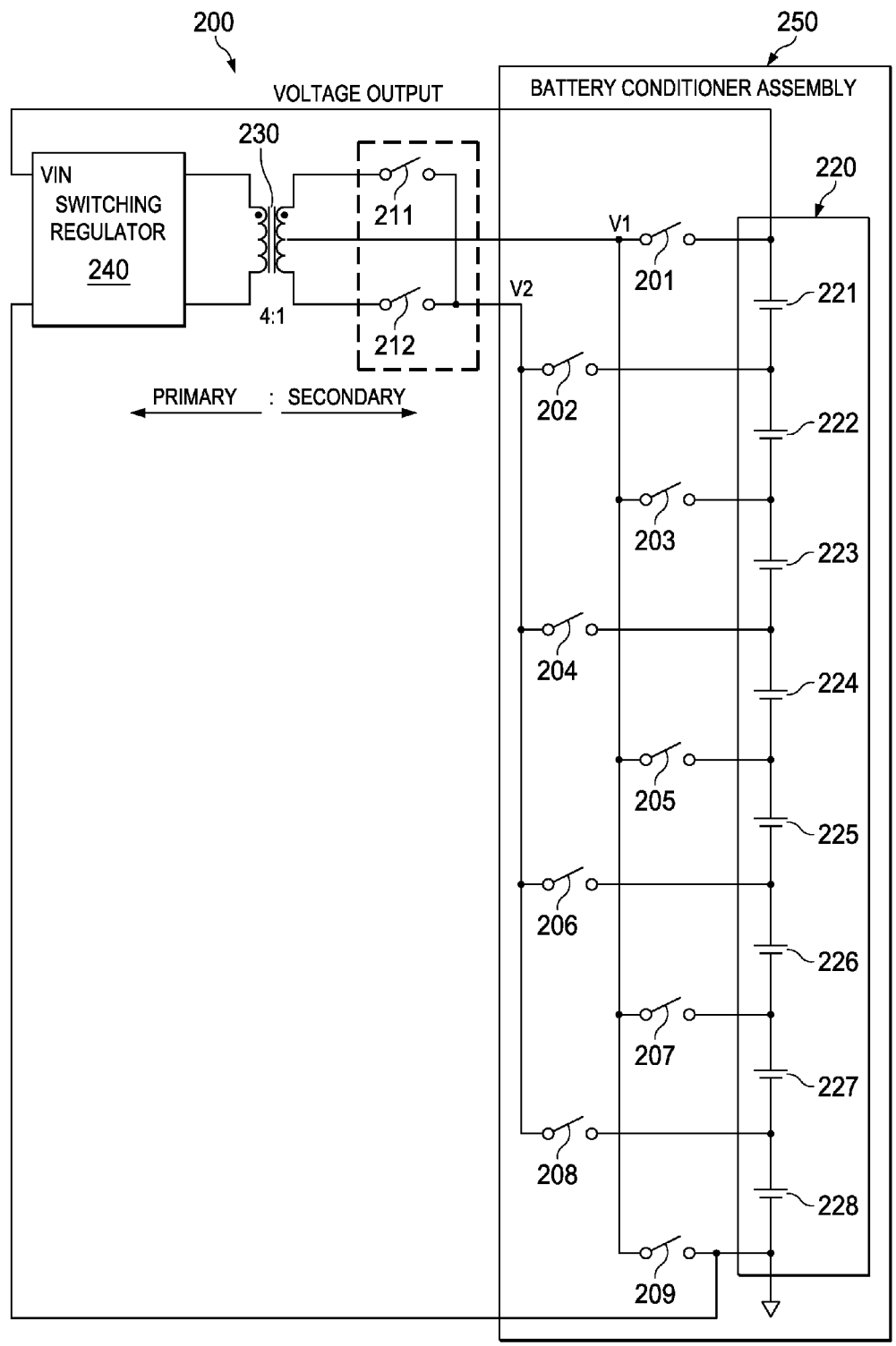
FIG. 2 is a schematic diagram of another conventional switch-array based active balancing system.

FIG. 2 is a schematic diagram of another conventional switch-array based active balancing system 200. The system 200 includes a switching regulator 240, transformer 230, and a battery conditioner assembly 250 that includes the battery pack 220. The battery pack 220 includes multiple cells (e.g., cells 221, 222, 223, 224, 225, 226, 227 and 228), so the battery pack 220 is operable to store and provide power.

The system 200 is operable to individually balance the output voltage of a selected cell of the battery pack 220 by suitably operating (e.g., opening or closing) a selected one of secondary-side switches 211 and 212 (which are collectively, secondary-side polarity switches) and a selected pair of secondary-side switches 201, 202, 203, 204, 205, 206, 207, 208, 209, 211 and 212. The secondary-side switches are operable to selectively couple a first terminal of a selected cell of battery pack 220 to a first terminal of the secondary of the transformer 230 and to selectively couple a second terminal of the selected cell battery pack 220 to a second terminal of the secondary of the transformer 230.

Selectively coupling the first and second terminals of a selective cell to the respective terminals of the secondary of the transformer 230 allows each selected cell to be either charged or discharged in accordance with which secondary-side polarity switch 211 or 212 is selected. Closing of the selected secondary-side polarity switch (e.g., switch 211 or 212) controls the direction (e.g., polarity) of a current supplied the secondary of transformer 230 to the selected cell.

For example, the cell 222 can be (e.g., at least partially) charged by closing switch 212 and simultaneously actuating the switches 202 and 203 to create a charging current (not shown). Moreover, the cell 222 can be (e.g., at least partially) discharged by closing switch 211 and simultaneously actuating the switches 202 and 203 to create a discharging current (not shown). Because power is transferred inductively across the transformer 230, the selected switches are typically actuated repeatedly (e.g., repeatedly toggled on and off) to create a change in current that facilitates transference of power across the transformer 230.

In this example, the battery pack 220 includes eight cells (e.g., cells 221, 222, 223, 224, 225, 226, 227 and 228). Accordingly, each cell of the battery pack 220 ideally has a voltage that is one-eighth of the nominal voltage of battery pack 220. The transformer 230 is a center-tap transformer has a voltage conversion (e.g., "turns") ratio (e.g., 4:1 end-to-end) that is in accordance with the number of cells in the battery pack 220. Because each cell is coupled to the center tap of the transformer 230 (e.g., node V1), only approximately half of the "turns" of the transformer 230 conduct current when balancing cells of the battery pack 220. In contrast with the system 100 (FIG. 1), the system 200 selectively couples node V2 to either non-center tap terminal (of the secondary side) of transformer 230 while selectively coupling node V1 to the center tap terminal of the transformer 230.

The center tap of the secondary coil in the transformer 230 is ideally located at the exact (e.g., electrical) middle of the secondary coil. However, manufacturing an equal number of turns (e.g., of windings) in each half of the secondary coil is relatively difficult in typical manufacturing processes of transformers. In the example system 200, the center tap divides the secondary coil of the transformer 230 into an upper coil (which provides the charging current for balancing) and a lower coil (which provides the discharging current for balancing).

For example, if the upper coil has 5% more turns than the number of turns of the lower coil, then the total charge of charging and the total charge of discharging in the same charging/discharging cycle T are:

$$Q_{charge} = \int_0^T i_{charge}(t)dt \quad (1)$$

and $$Q_{discharge} = \int_0^T i_{discharge}(t)dt = 0.95 \cdot \int_0^T i_{charge}(t)dt = 0.95 \cdot Q_{charge} \quad (2)$$

where Q is charge, T is charging or discharging time, and i is current. The mismatch charge in charging and discharging phases often result in inaccurate voltage levels (and the associated problems of having mismatched voltages between battery cells) when the battery cells achieve in the balanced state (e.g., as determined by switching regulator 240).

Figure 3:
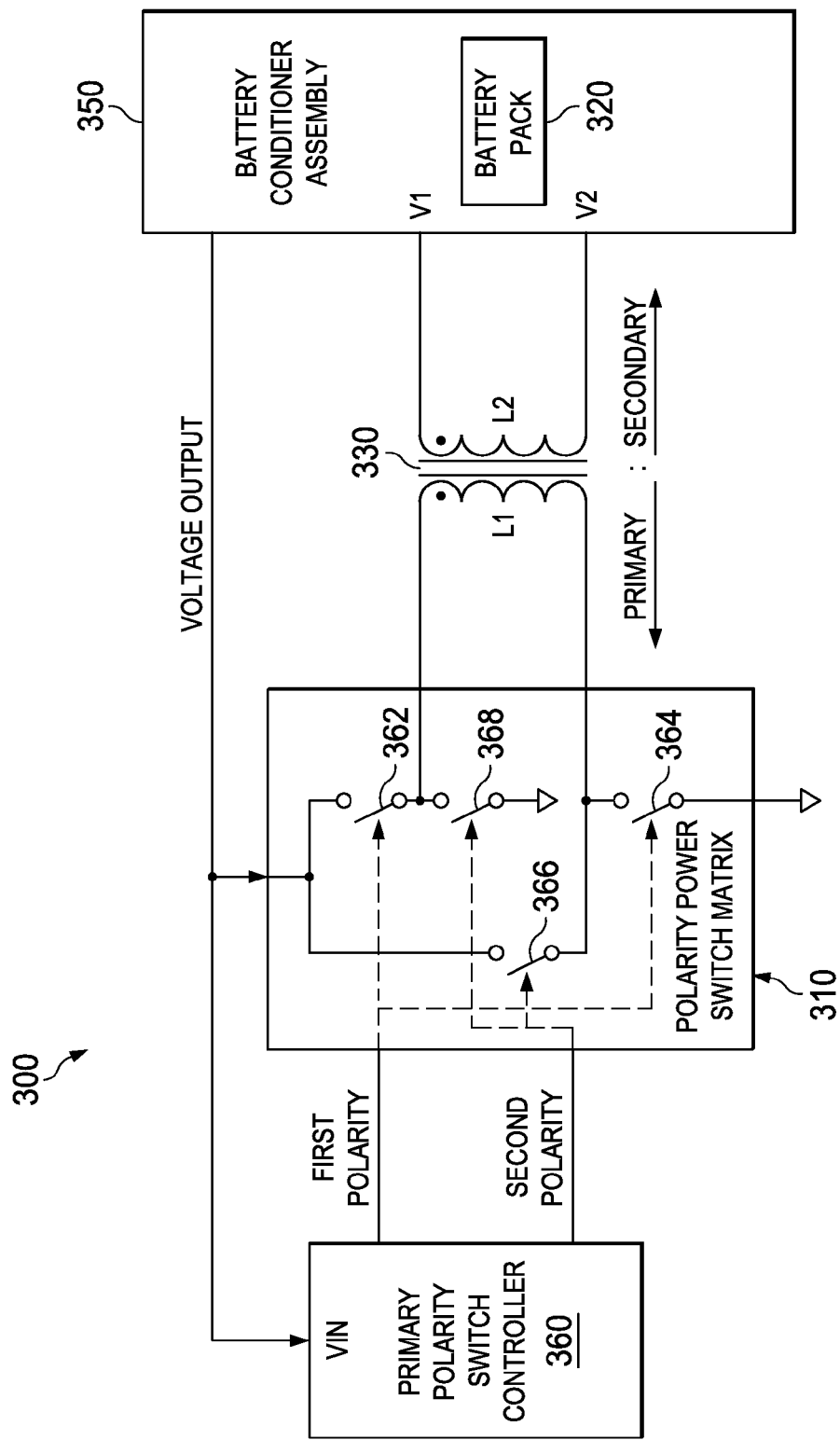
FIG. 3 is a schematic diagram of an active balancing system of example embodiments.

FIG. 3 is a schematic diagram of an active balancing system, indicated generally at 300, of example embodiments. The system 300 is operable to selectively balance individual energy-storage units (e.g., cells) in an energy-storage device (e.g., a battery pack 320) of a battery conditioner assembly 350.

Unlike the system 200, a transformer 330 of the system 300 does not necessarily include a center tap in its secondary winding L2 (e.g., for reducing the number of secondary-side switches). Accordingly, the system 300 avoids mismatch issues of an electrically unbalanced center tap, which might otherwise exist with a center-tap topology transformer.

The system 300 includes a primary polarity switch controller 360. The controller 360 is operable to sense (e.g., at a voltage input pin VIN) a voltage output from the assembly 350. The voltage output of the assembly 350 is optionally the voltage (e.g., total voltage) of the battery pack 320 or the voltage of a selected cell of the battery pack 320 (e.g., as discussed below with reference to FIG. 6). The controller 360 is operable to control a polarity power switch matrix 310 for selecting one of a first-polarity current and a second-polarity current (e.g., in response to sensing a voltage of the selected cell of the battery pack 320).

Through the matrix 310, the controller 360 is coupled to first and second terminals of a primary winding L1 of the transformer 330. The matrix 310 is operable to selectively control the existence of (and the direction of) current flow through the primary winding L1 of the transformer 330. The transformer 330 is operable to inductively couple power from the primary winding L1 to the secondary winding L2. The secondary winding L2 of the transformer 330 includes a first terminal and a second terminal for coupling power to nodes V1 and V2, respectively, of the assembly 350. Accordingly, the polarity of the output of the secondary winding L2 of the transformer 330 is controlled by switching that is performed on a primary side of the system 300.

In various embodiments where the secondary winding L2 of the transformer 330 does not include a center tap, the lack of a center tap: avoids problems resulting from total charge mismatch due to unequal division of the center tap in the charging/discharging phases; and maintains a reduced number of secondary-side switches (e.g., as discussed below with reference to FIG. 7).

The matrix 310 is operable to selectively actuate pairs of primary-side polarity switches 362, 364, 366 and 368. As discussed below with respect to FIG. 4 and FIG. 5: (a) if the switches 362 and 364 are closed, and if the switches 366 and 368 are open, then the transformer 330 generates a current of a first polarity; and (b) if the switches 366 and 368 are closed, and if the switches 362 and 364 are open, then the transformer 330 generates a current of a second polarity (opposite of the first polarity). As discussed below with reference to FIG. 6, the first and second polarity currents are operable to balance the voltage of a selected cell of the battery pack 320 by either charging or discharging that cell.

Figure 4:
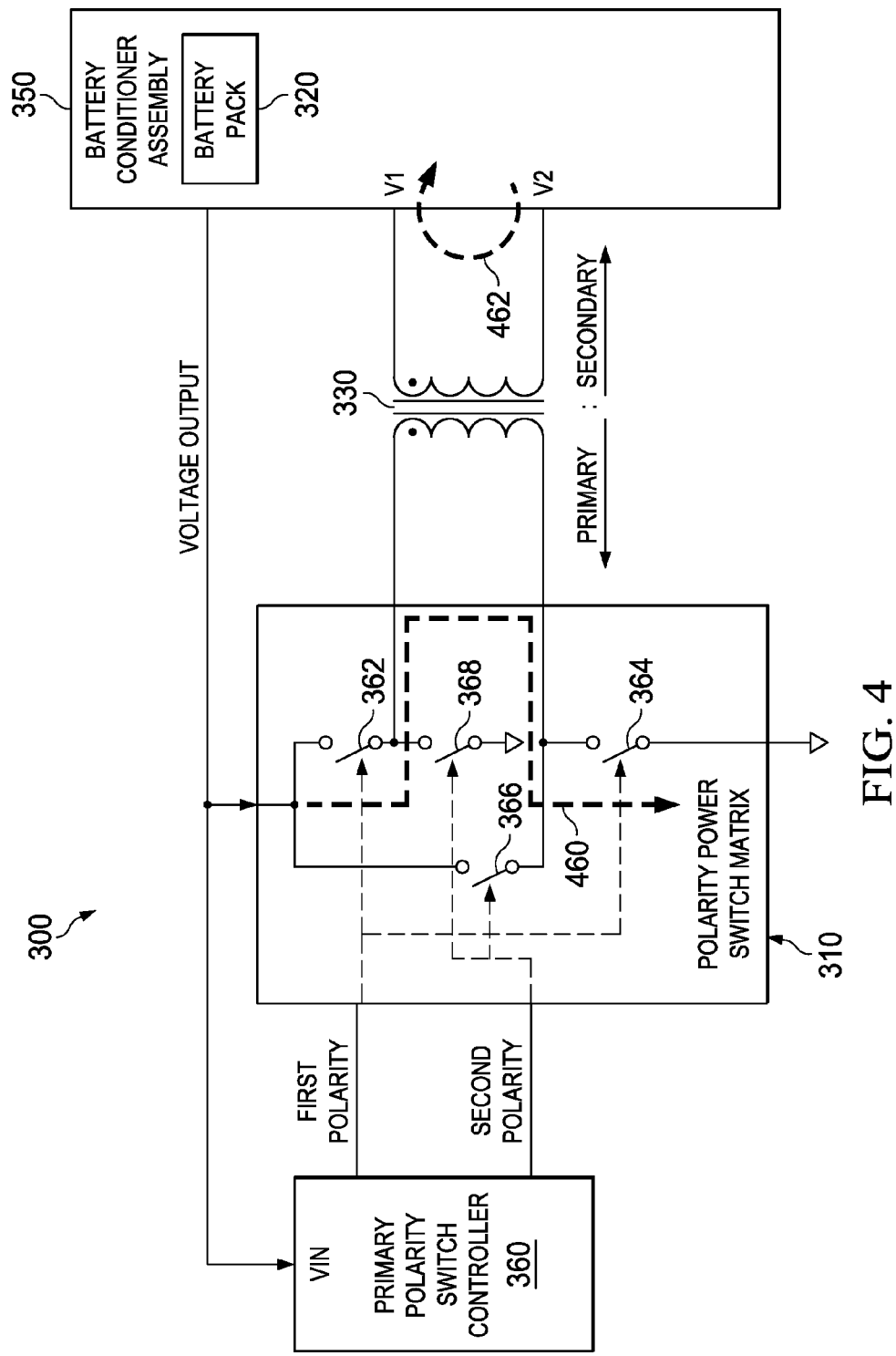
FIG. 4 is a schematic diagram of a switch controller of the system of FIG. 3 operating in a first polarity.

FIG. 4 is a schematic diagram of a switch controller of the system 300 operating in a first polarity. The system 300 is operable to selectively balance individual cells in the battery pack 320 of the assembly 350, such as by generating a first-polarity current 460.

In response to the voltage at VIN, the controller 360 selectively signals the matrix 310 to generate the first-polarity current 460, so the matrix 310 causes the transformer 330 to generate the first-polarity current 460 through the primary winding L1 of the transformer 330 by: (a) closing the switches 362 and 364; and (b) opening the switches 366 and 368.

The transformer 330 inductively couples power from the primary winding L1 to the secondary winding L2, in order to generate a secondary-side first-polarity current 462 (e.g., having the same polarity as the first-polarity current 460). As discussed below with reference to FIG. 6, the first-polarity current 460 is operable to balance the voltage of a selected cell by either charging or discharging that cell.

Figure 5:
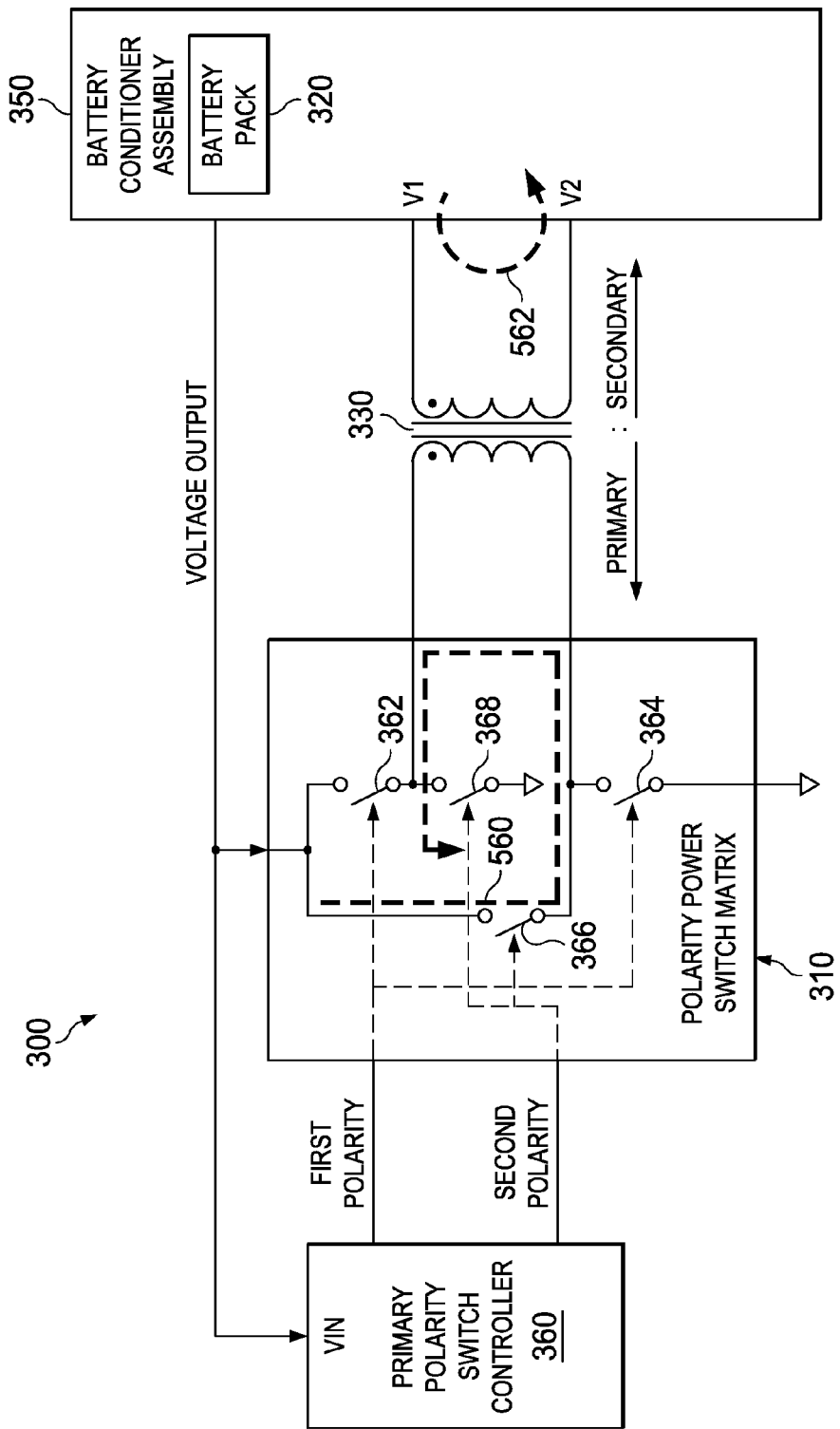
FIG. 5 is a schematic diagram of a switch controller of the system of FIG. 3 operating in a second polarity.

FIG. 5 is a schematic diagram of a switch controller of the system 300 operating in a second polarity. The system 300 is operable to selectively balance individual cells in the battery pack 320 of the assembly 350, such as by generating a second-polarity current 560.

In response to the voltage at VIN, the controller 360 selectively signals the matrix 310 to generate the second-polarity current 560, so the matrix 310 causes the transformer 330 to generate the second-polarity current 560 through the primary winding L1 of the transformer 330 by: (a) closing the switches 366 and 368; and (b) opening the switches 362 and 364.

The transformer 330 inductively couples power from the primary winding L1 to the secondary winding L2, in order to generate a secondary-side second-polarity current 562 (having the same polarity as the second-polarity current 560). As discussed below with reference to FIG. 6, the second-polarity current 560 is operable to balance the voltage of a selected cell by either charging or discharging that cell.

Figure 6:
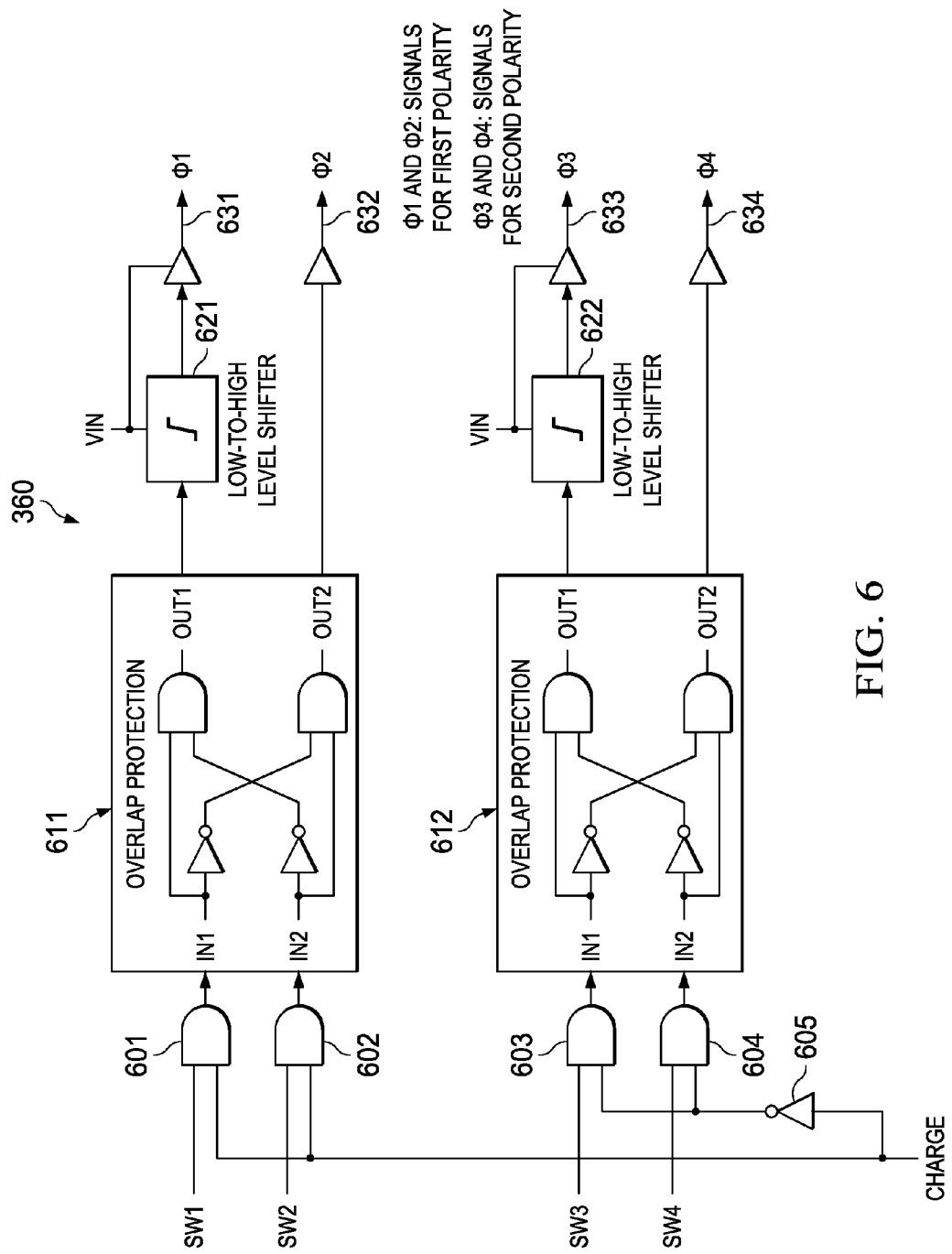
FIG. 6 is a schematic diagram of a primary-side polarity switch of the system of FIG. 3.

FIG. 6 is a schematic diagram of a primary-side switch controller 360 of the system 300 (FIG. 3). The signals SW1, SW2, SW3, SW4 and CHARGE are control signals received from (and generated by) a switch controller, such as main switch controller 794 (described below with reference to FIG. 7). The signals Φ1, Φ2, Φ3 and Φ4 are (e.g., respectively) gate-driving signals of the high-side switch 362 of the first polarity, the low-side switch 364 of the first polarity, the high-side switch 366 of the second polarity and the low-side switch 368 of the second polarity. When a gate driving signal is asserted (e.g., having a logic high level), the associated (e.g., corresponding) switch turns on (e.g., conducts). When the associated switch is in a turned-on (e.g., closed) state, both terminals of the turned-on (primary-side) switch are in the same logic state (e.g., by the second terminal being "pulled up" to the voltage output of the assembly 350 or "pulled down" to ground).

The controller 360 determines the logic states of signals Φ1 and Φ2 in response to the CHARGE, SW1 and SW2 signals, and determines the logic states of signals Φ3 and Φ4 in response to the CHARGE, SW3 and SW4 signals. The controller 360 includes logic gates 601, 602, 603, 604 and 605, which are operable in response to the CHARGE signal to control the state of the switches of the matrix 310, such that a selected battery cell is either charged or discharged.

For example, when the CHARGE signal is high, the logic level of signal SW1 is transferred to signal Φ1 and the logic level of signal SW2 is transferred to signal Φ2. During this time, signals Φ3 and Φ4 remain low, which maintains switch 366 and switch 368 in open states (e.g., in a high-impedance state). An overlap protection circuit 611 is operable to prevent the logic levels of signals Φ1 and Φ2 from simultaneously being asserted. The simultaneous assertion (e.g., if allowed) would otherwise cause both the switch 362 and the switch 364 to be closed at the same time and accordingly short the voltage output of the assembly 350 to ground and causing a "shoot-through" condition that likely can damage the closed switches 362 and the switch 364.

When the CHARGE signal is low, the logic level of signal SW3 is transferred to signal Φ3 and the logic level of signal SW4 is transferred to signal Φ4. During this time, signals Φ1 and Φ2 remain low, which maintains switch 362 and switch 364 in open states. An overlap protection circuit 612 is operable to prevent the logic levels of signals Φ3 and Φ4 from simultaneously being asserted. The simultaneous assertion (e.g., if allowed) would otherwise cause both the switch 366 and the switch 368 to be closed at the same time and accordingly short the voltage output of the assembly 350 to ground and causing a "shoot-through" condition that likely can damage the closed switches 366 and the switch 368.

Level shifters 621 and 622 are operable to shift the voltage of the high-hide switch control signals SW1 and SW3 for driving the high-side switches 362 and 366. In one example, the control signals SW1 and SW3 have a maximum voltage of around 5 volts (which can be unsuitable for driving the gates of the switches 362 and 366). The level shifters 621 and 622 are operable to generate control signals, in response to output signals from the overlap protection circuits 611 and 612. The level-shifted control signals have a voltage range (e.g., having a maximum voltage of VIN) that is suitable for driving the inputs of the high-side gate drivers 631 and 633. The high-side gate drivers 631 and 633 are operable to generate the signals Φ1 and Φ3 with the sufficient voltage to turn the high-side power switches 362 and 366 on.

Low-side gate drivers 632 and 634 operate at the voltage range of the supply voltage of logic gates and ground. In one example, the drivers 632 and 634 are implemented with transistors similar to the design and implementation technology of the logic gates' transistors. The low-side gate drivers 632 and 634 are operable to buffer the signals from the overlap protection blocks 611 and 612 to provide the sufficient drivability for signals Φ2 and Φ4 to turn the low-side power switches 364 and 368 on.

In this embodiment, the controller 360 is implemented by relatively few (and simple) logic gates. In one example, the overlap protection blocks 611 and 612 are implemented by two inverters and two AND gates. Accordingly, the controller 360 is readily integrated with the matrix 310 by the same high voltage processes that implement the switches of the matrix 310. Those high voltage processes sometimes exclude low-voltage, small feature-sized digital transistors for more complex digital functions.

Figure 7:
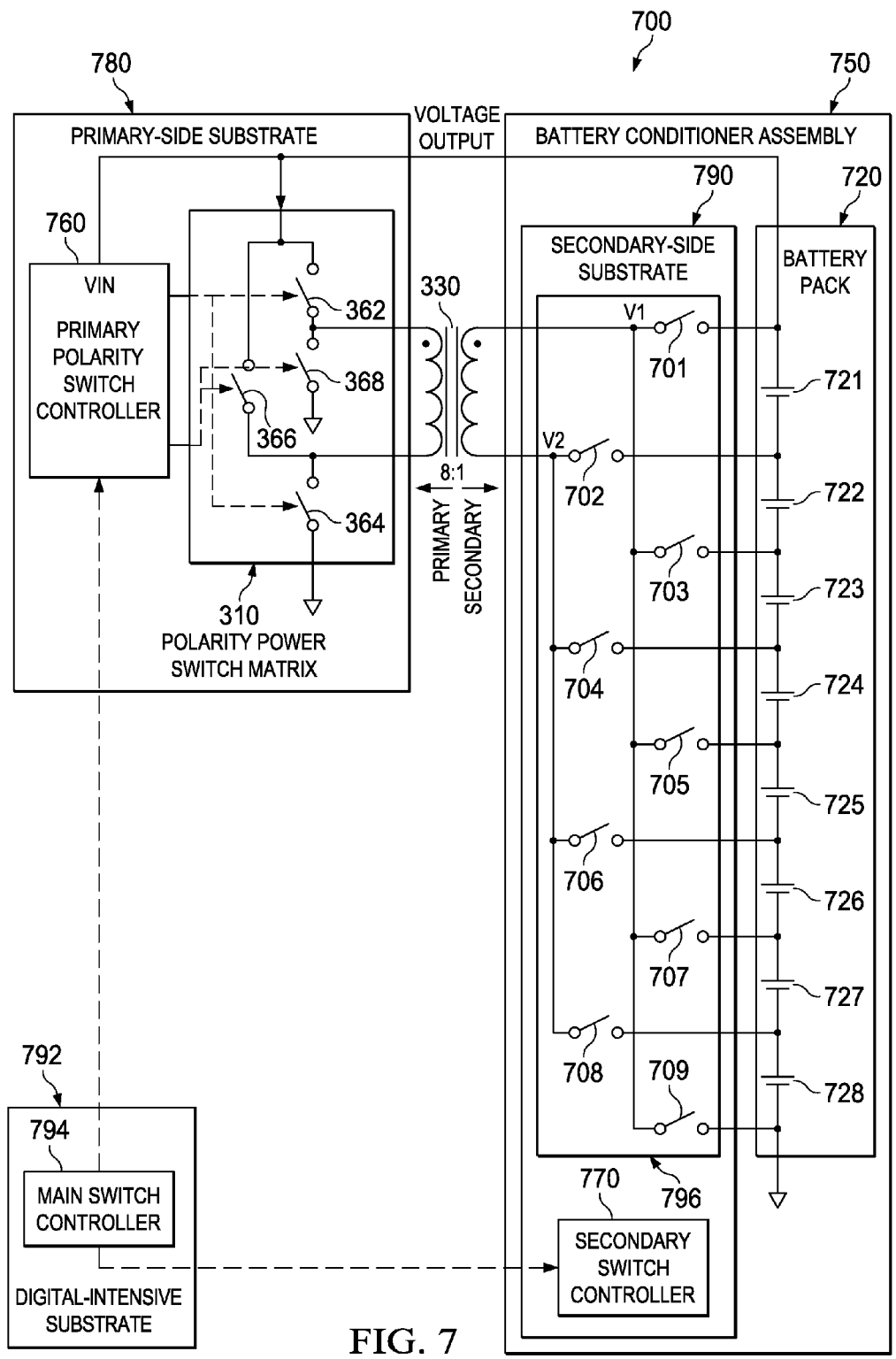
FIG. 7 is a schematic diagram of an alternative version of the system of FIG. 3 for balancing a battery pack.

FIG. 7 is a schematic diagram of an alternative version, indicated generally at 700, of the system 300 for balancing a battery pack. The system 700 includes a primary polarity switch controller 760 and the matrix 310, each of which is arranged on a primary-side substrate 780. The primary-side substrate includes components that are electrically operable with the primary windings of transformer 330 and are not necessarily physically located on the same physical "side" of the primary-side of the transformer 330. The primary-side substrate 780 optionally is a monolithic semiconductor substrate.

The system 700 further includes a battery conditioner assembly 750. The assembly 750 includes a battery pack 720 and a secondary-side substrate 790. The battery pack 720 includes multiple cells such as cells 721, 722, 723, 724, 725, 726, 727 and 728, so the battery pack 720 is operable to store and provide power. The secondary-side substrate 790 includes a secondary-side switch matrix 796 (e.g., which includes switches 701, 702, 703, 704, 705, 706, 707, 708 and 709) and a secondary switch controller 770. The controller 770 operates in conjunction with the controller 360 and is optionally implemented (in whole or in part) on the primary-side substrate 780.

To reduce the number of switches in the secondary-side substrate 790, every-other battery cell (e.g., the even-numbered cells) in the battery pack 720 is charged when selectively coupled to a node (e.g., node V1 or V2) of a given polarity, while the remaining cells (e.g., the odd-numbered cells) are discharged when selectively coupled to the given node. For example, when node V1 has a negative polarity (and node V2 has a positive polarity) and switches 703 and 704 are closed, the battery cell 722 is charged. When node V1 has a negative polarity (and node V2 has a positive polarity) and switches 702 and 703 are closed, the battery cell 723 is discharged.

A main switch controller 794 is operable to control (e.g., including coordinating functions of) the controllers 760 and 770. The main switch controller is optionally formed on a digital-intensive substrate 792 that is separate from at least one of the primary-side substrate 780 and the secondary-side substrate 790. The digital-intensive substrate 792 is a substrate in which, for example, a complex digital circuitry (such as a processor or digital control logic) is formed by processes suitable for complex digital circuitry. In contrast, the substrates 780 and 790 can include circuitry formed by high-voltage (e.g., relative to standard logic levels that are nominally ground or 5 volts) processes, which are optimized for power transistors, and which sometimes exclude high-layout-density transistors for more complex digital circuitry.

The controller 760 is operable to control the matrix 310 to select one of a first-polarity current and a second-polarity current in response to sensing a voltage of a selected cell of battery pack 720. The selected one of the first-polarity current and a second-polarity current are coupled to the primary-side of the transformer 330. The transformer 330 is operable to transfer power from the selected one of the first-polarity current and a second-polarity current to the secondary side of the transformer 330. Accordingly, the controller 760 is operable to sense (e.g., via the closed associated switches) the voltage of the selected cell and determine whether to apply a charging or a discharging current to a selected cell, for example. Each of the cells 721, 722, 723, 724, 725, 726, 727 and 728 is optionally selected for sensing and (e.g., in response to the sensing) is either charged or discharged in turn by actuating the cell's associated secondary-side switches.

The secondary side of the transformer 330 includes first and second terminals that are coupled (e.g., connected) to nodes V1 and V2 of the secondary-side substrate 790. The controller 770 is operable to selectively actuate a pair of secondary-side switches, such that the selected pair of secondary-side switches is in a state of being closed over a time in which a balancing current is applied to a cell that is associated with the selected pair of secondary-side switches.

The controller 770 is operable to receive (e.g., sense) an indication of a metric (e.g., voltage) of a selected cell for providing stored power to a battery having multiple cells. The indication of the metric of the selected cell is optionally generated: (a) by the controller 760; (b) by the controller 770; or (c) a combination of the controllers 760 and 770. The indication of the metric is: (a) a voltage quantity; (b) an undervoltage flag (e.g., "cell needs to be charged"); (c) an overvoltage flag (e.g., "cell needs to be discharged"); and/or (d) any quantity from which a determination of whether to balance (e.g., charge or discharge) the selected cell can be made.

In response to the determination that a balancing current is to be applied to a selected cell, the controller 770 is operable to close switches that are coupled respectively to the first and second terminals of the selected cell. Moreover, the selected polarity of the polarity controller is determined both: in response to a determination of whether the selected cell is to be balanced by charging or discharging the selected cell; and in response to a determination of the polarity of the respective terminals of the selected cell.

Accordingly, the controller 760 asserts one of the "first polarity" and the "second polarity" signals to apply a voltage step function to the primary coil of transformer 330 in accordance with the determined selected polarity. Concurrently, the controller 770 closes switches coupled to the first and second terminals of the selected cell, in order to couple the balancing current (e.g., a discharging current or a charging current) through the selected cell. (The functionality of the controllers 760 and 770 is optionally shared, in whole or in part, between them; accordingly, such functionality can optionally be implemented on a single substrate or separate substrates.)

In a first example, switches 362 and 364 of the matrix 310 are closed (with switches 366 and 368 remaining open) to generate a primary-side, first-polarity current (such as first-polarity current 460). In conjunction with (e.g., under the control of) the controller 760, the controller 770 is operable to close switches 701 and 702 (with other secondary-side switches remaining open) to generate a secondary-side, first-polarity current (such as second-polarity current 462) for charging (e.g., partially charging) cell 721 of battery pack 720.

In a second example, switches 366 and 368 of the matrix 310 are closed (with switches 362 and 364 remaining open) to generate a primary-side, second-polarity current (such as second-polarity current 560). In conjunction with the controller 760, the controller 770 is operable to close switches 701 and 702 (with other secondary-side switches remaining open) to generate a secondary-side, second-polarity current (such as second-polarity current 562) for discharging (e.g., partially discharging) cell 721 of battery pack 720.

In a third example, switches 362 and 364 of the matrix 310 are closed (with switches 366 and 368 remaining open) to generate a primary-side, first-polarity current (such as first-polarity current 460). In conjunction with the controller 760, the controller 770 is operable to close switches 702 and 703 (with other secondary-side switches remaining open) to generate a secondary-side, first-polarity current (such as second-polarity current 462) for discharging cell 722 of battery pack 720.

In a fourth example, switches 366 and 368 of the matrix 310 are closed (with switches 362 and 364 remaining open) to generate a primary-side, second-polarity current (such as second-polarity current 560). In conjunction with the controller 760, the controller 770 is operable to close switches 702 and 703 (with other secondary-side switches remaining open) to generate a secondary-side, second-polarity current (such as second-polarity current 562) for charging cell 722 of battery pack 720.

Accordingly only two secondary-side switches are closed, so a resistance (e.g., a substantially maximum resistance) of two RDS (resistance drain-to-source) exists on the secondary side of transformer 330. Thus, the secondary coil current does not simultaneously flow through more than two switches for coupling the secondary coil current through a cell that is selected for balancing. In contrast, the system 200 (FIG. 2) has a resistance of three RDS (from one of the switches 211 and 212, and from two of the switches 201, 202, 203, 204, 205, 206, 207, 208, 209, 211 and 212) on the secondary side of transformer 230.

The system 100 (FIG. 1) also has a resistance of two RDS. But the system 100 incurs substantial penalties (e.g., in silicon area and/or cost), because the system 100 includes nearly twice as many secondary-side switches in comparison to the system 700.

Notwithstanding two primary-side switches in the matrix 310, power dissipation can be substantially reduced (in comparison to the system 100) by operating, for example, only two secondary-side switches in accordance with the equations disclosed below.

In a given ideal active balancing system, the power of the secondary side is equal to the power of the primary side:

$$Pout=Pin \quad (3)$$

where Pout is the power of the secondary side and Pin is the power of the primary side.

Expressing power in terms of voltage and current:

$$Is \times Vs = Ip \times Vp \quad (4)$$

where Is is the current of the secondary side, Vs is the voltage of the secondary side, Ip is the current of the primary side, and Vp is the voltage of the primary side.

Assuming a turns ratio of 1:8, the transferred power (e.g., primary side to secondary side) results in 8 times the applied current and 1/8 times the applied voltage:

$$(8 \times Ip) \times (1/8 \times Vp) = Ip \times Vp \quad (5)$$

Any resistance (such as caused by the RDS of one or more secondary-side switches) causes power dissipation (which can reduce efficiency) of the otherwise ideal power balancing system:

$$Pdiss = I \times I \times R \quad (6)$$

where Pdiss is the power dissipation, generally.

Using Eq. (6), the power dissipation of the primary side is:

$$Pdiss(pri) = Ip \times Ip \times R \quad (7)$$

where Pdiss(pri) is the power dissipation of the primary side.

Likewise, the power dissipation of the secondary side is:

$$Pdiss(sec) = 64 \times Ip \times Ip \times R \quad (8)$$

where Pdiss(sec) is the power dissipation of the secondary side.

Substituting Eq. (7) in Eq. (8):

$$Pdiss(sec) = 64 \times Pdiss(pri) \quad (9)$$

Accordingly, any resistance on the secondary side of the given ideal active balancing system is the square of the turns ratio (e.g., 8×8=64) greater than the equivalent resistance on the primary side of the given ideal active balancing system.

In the system 700, the power dissipation of the secondary side substantially results from the two secondary-side side switches having a total nominal resistance of (e.g., only) 2×RDS. If the transformer has a windings ratio of 8:1, a primary switch contributes around $1/64^{th}$ of the equivalent power dissipation (if, for example, the "primary" switches had been arranged on the secondary side). In contrast, an example of a conventional active balancing system has a power dissipation of the secondary side that substantially results from the three secondary-side switches having a total nominal resistance of 3×RDS.

Figure 8:
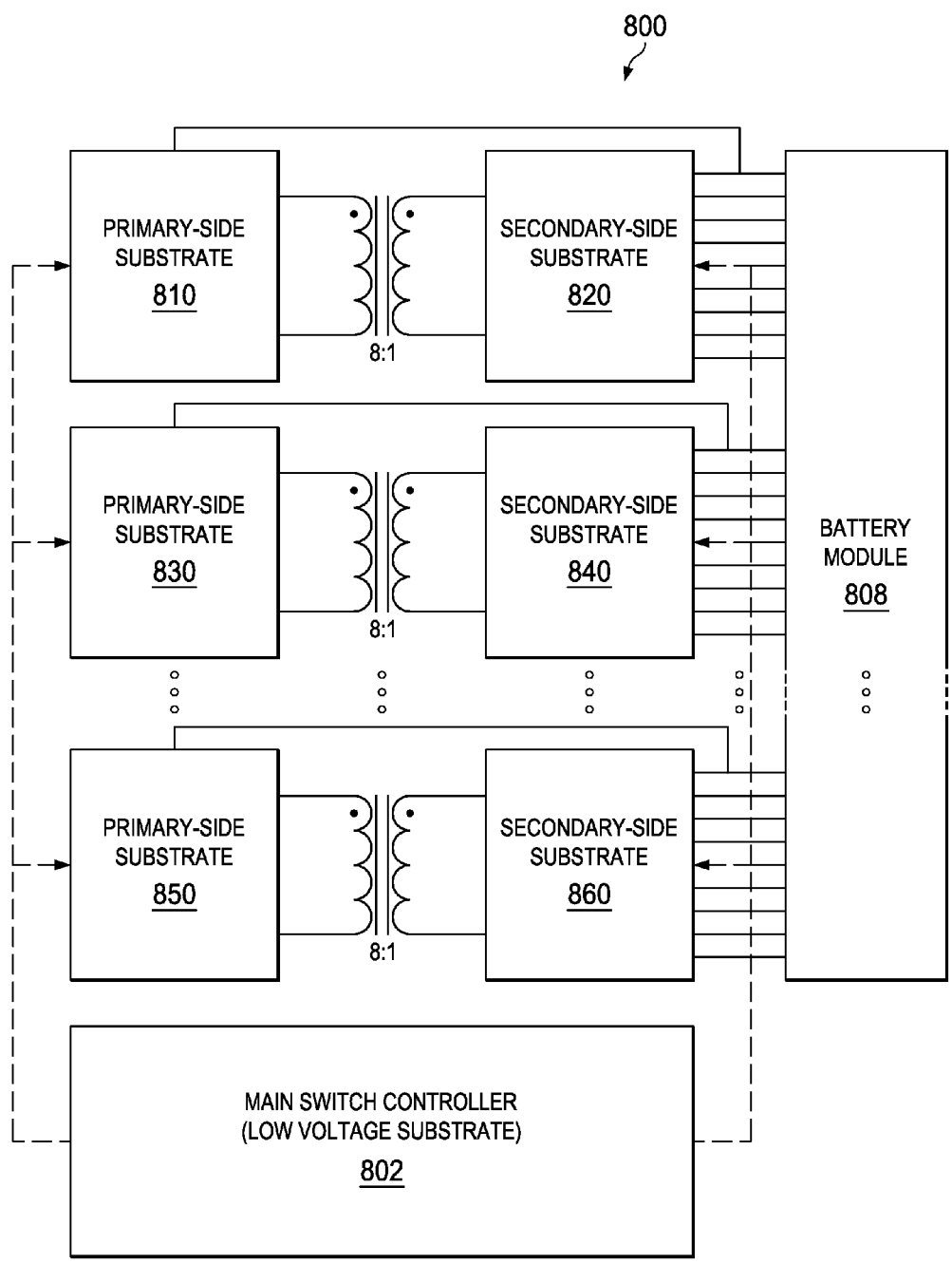
FIG. 8 is a schematic diagram of an alternative version of the system of FIG. 3 for balancing multiple battery packs.

FIG. 8 is a schematic diagram of an alternative version, indicated generally at 800, of the system 300 for balancing multiple battery packs. The system 800 includes a battery module 808, which includes multiple battery packs (three battery packs are shown, but more or fewer are optionally implemented in various embodiments). Each such battery pack includes multiple cells. Each such cell is operable to be conditioned (e.g., by selective application of a charging current or a discharging current). The main switch controller 802 selects the primary-side polarity and controls the opening and closing of secondary-side switches, which are associated with a cell that is selected for conditioning.

For example, a primary-side substrate 810 includes circuits for selectively coupling (e.g., including selecting a polarity of the current and voltage of) power of a selected polarity to the primary windings of transformer 812. The transformer 812 is operable to convert the output voltage of the battery module 808 to a voltage that is suitable for charging an individual cell of a first battery pack of battery module 808. The secondary substrate 820 includes circuitry for selectively coupling power from the secondary windings of the transformer 812 to a selected cell of a first battery pack of module 808. Accordingly, any of the cells of the first battery pack are operable to be selectively conditioned (e.g., charged or discharged).

Likewise, a primary-side substrate 830 includes circuits for selectively coupling power of a selected polarity to the primary windings of transformer 834. The transformer 834 is operable to convert the output voltage of the battery module 808 to a voltage that is suitable for charging an individual cell of a second battery pack of battery module 808. The secondary substrate 840 includes circuitry for selectively coupling power from the secondary windings of the transformer 834 to a selected cell of the second battery pack of module 808. Accordingly, any of the cells of the second battery pack can be selectively conditioned.

Similarly, a primary-side substrate 850 includes circuits for selectively coupling power of a selected polarity to the primary windings of transformer 856. The transformer 856 is operable to convert the output voltage of the battery module 808 to a voltage that is suitable for charging an individual cell of a third battery pack of battery module 808. The secondary substrate 860 includes circuitry for selectively coupling power from the secondary windings of the transformer 856 to a selected cell of the third battery pack of module 800. Accordingly, any of the cells of the third battery pack can be selectively conditioned.

In one example, the primary-side substrates 810, 830 and 850 (and the secondary-side substrates 820, 840 and 860) are implemented by semiconductor manufacturing processes that are suitable for power transistors (which can occupy substantially more area than processes that are suitable for logic gates). In this example, the main switch controller 802 is formed on a low-voltage substrate. Such low-voltage substrates can be implemented by manufacturing techniques that are suitable for logic gates (which can occupy substantially less area than processes that are suitable for power transistors). Each primary-side substrate and each secondary-side substrate are separate from each other. The substrate of the main switch controller 802 is separate from each of the primary-side substrates and each of the secondary-side substrates, which helps to reduce layout area and power consumption.

Figure 9:
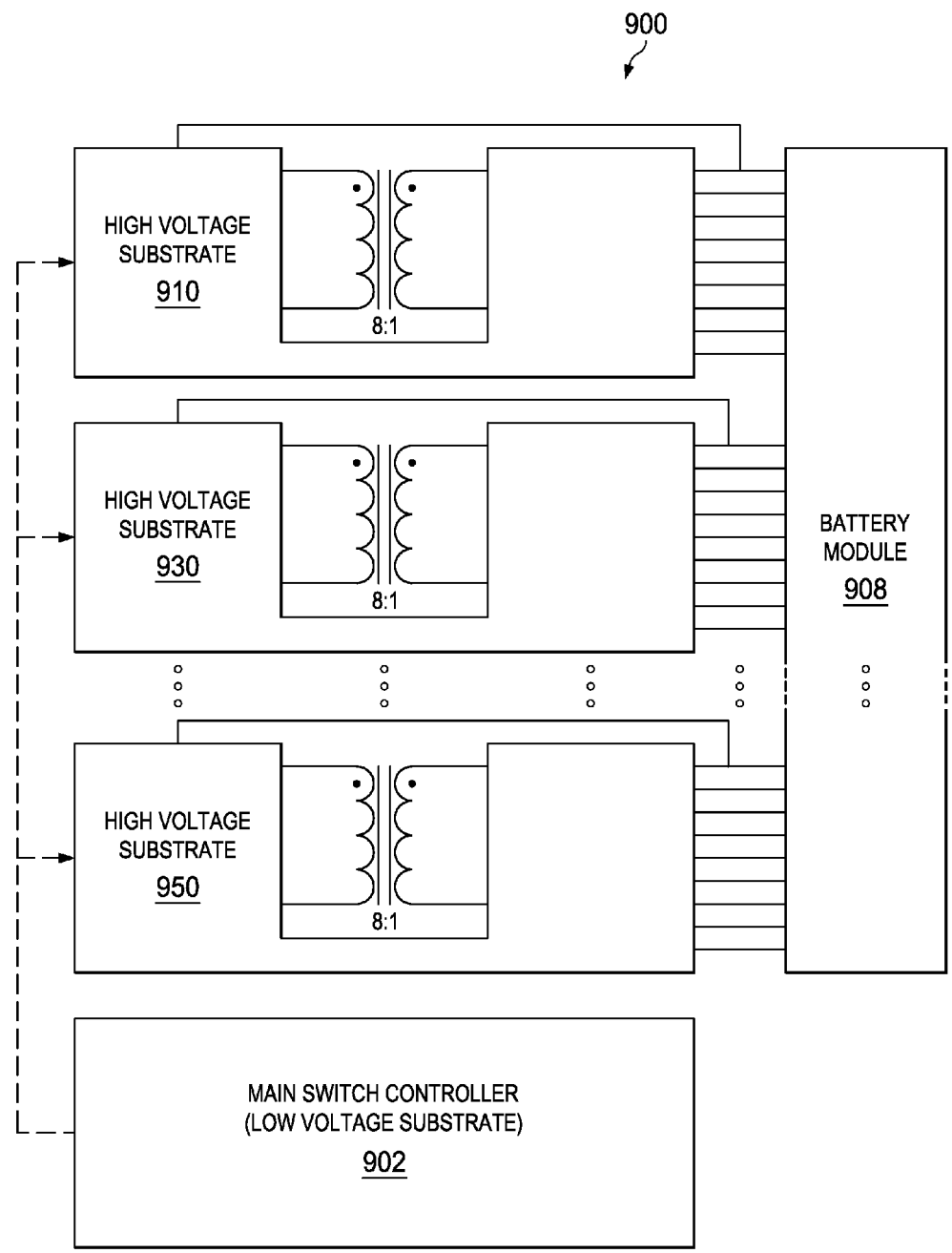
FIG. 9 is a schematic diagram of another alternative version of the system of FIG. 3 for balancing multiple battery packs.

FIG. 9 is a schematic diagram of another alternative version, indicated generally at 900, of the system 300 for balancing multiple battery packs. The system 900 includes a battery module 908, which includes multiple battery packs (three battery packs are shown, but more or fewer are optionally implemented in various embodiments). Each such battery pack includes multiple cells. Each such cell is operable to be conditioned (e.g., by selective application of a charging current or a discharging current). The main switch controller 902 selects the primary-side polarity and controls the opening and closing of secondary-side switches, which are associated with a cell that is selected for conditioning.

For example, a high-voltage substrate 910 includes circuits for selectively coupling (e.g., including selecting a polarity of the current and voltage of) power of a selected polarity to the primary windings of transformer 920. The transformer 920 is operable to convert the output voltage of the battery module 908 to a voltage that is suitable for charging an individual cell of a first battery pack of battery module 908. The high-voltage substrate 910 further includes circuitry for selectively coupling power from the secondary windings of the transformer 920 to a selected cell of a first battery pack of module 908. Accordingly, any of the cells of the first battery pack can be selectively conditioned (e.g., charged or discharged).

Likewise, a high-voltage substrate 930 includes circuits for selectively coupling power of a selected polarity to the primary windings of transformer 940. The transformer 940 is operable to convert the output voltage of the battery module 908 to a voltage that is suitable for charging an individual cell of a second battery pack of battery module 908. The high-voltage substrate 930 further includes circuitry for selectively coupling power from the secondary windings of the transformer 940 to a selected cell of the second battery pack of module 900. Accordingly, any of the cells of the second battery pack can be selectively conditioned.

Similarly, a high-voltage substrate 950 includes circuits for selectively coupling power of a selected polarity to the primary windings of transformer 960. The transformer 960 is operable to convert the output voltage of the battery module 908 to a voltage that is suitable for charging an individual cell of a third battery pack of battery module 908. The high-voltage substrate 950 includes circuitry for selectively coupling power from the secondary windings of the transformer 960 to a selected cell of the third battery pack of module 900. Accordingly, any of the cells of the third battery pack can be selectively conditioned.

In one example, the high-voltage substrates 910, 930 and 950 are implemented by semiconductor manufacturing processes that are suitable for power transistors (which can occupy substantially more area than processes that are suitable for logic gates). In this example, the main switch controller 902 is formed on a low-voltage substrate. Such low-voltage substrates can be implemented by manufacturing techniques that are suitable for logic gates (which can occupy substantially less area than processes that are suitable for power transistors). The substrate of the main switch controller 902 is separate from each of the high-voltage substrates and each of the high-voltage substrates, which helps to reduce layout area and power consumption.

FIG. 10 is a logic diagram of logic states of the primary-side polarity switch of FIG. 6. Logic diagram 1000 is arranged as a series of columns, where each column represents (e.g., possible) logic states of a signal. Columns 1001, 1002, 1003, 1006 and 1007 represent logic states for the input signals CHARGE, SW1, SW2, SW3 and SW4, respectively. Columns 1004, 1005, 1008 and 1009 represent logic states for the output signals $\Phi 1$, $\Phi 2$, $\Phi 3$ and $\Phi 4$, respectively.

When the input signal CHARGE is logic-high, the states of the input signals of SW1 and SW2 are transferred to the output signals $\Phi 1$ and $\Phi 2$, while output signals $\Phi 3$ and $\Phi 4$ are forced to a logic-low state irrespective of the logic states of SW3 and SW4. When the input signal CHARGE is logic-low, the states of the input signals of SW3 and SW4 are transferred to output signals $\Phi 3$ and $\Phi 4$, while output signals $\Phi 1$ and $\Phi 2$ are forced to a logic-low state irrespective of the logic states of SW1 and SW2.

The highlighted portion of columns 1002, 1003, 1004 and 1005 demonstrate the overlap protection scheme of overlap protection circuit 611. When input signals SW1 and SW2 are both logic-high, signals $\Phi 1$ and $\Phi 2$ are forced to a logic-low state by operation of the overlap protection block 611.

Likewise, the highlighted portion of columns 1006, 1007, 1008 and 1009 demonstrate the overlap protection scheme of overlap protection circuit 612. When input signals SW3 and SW4 are both logic-high, signals $\Phi 3$ and $\Phi 4$ are forced to a logic-low state by operation of the overlap protection block 612.

Modifications are possible in the described embodiments, and other embodiments are possible, within the scope of the claims.

What is claimed is:
1. A device, comprising:
a transformer having a primary coil and a secondary coil;
a controller for: receiving an indication of a metric of a cell of a battery; and, in response thereto, outputting at least one signal to select a polarity of a balancing current for balancing the cell; and
at least one polarity switch, coupled between the transformer and the controller, for: receiving the at least one signal from the controller; and, in response thereto, selectively coupling a received current to a selected terminal of the primary coil for causing the transformer to generate a primary current through the primary coil, wherein the selected terminal is one of a first terminal and a second terminal of the primary coil;
wherein the transformer is for: generating the balancing current through the secondary coil by inductively coupling the primary coil to the secondary coil; and outputting the balancing current having the selected polarity for balancing the cell;
wherein: if the selected terminal is the first terminal of the primary coil, then the primary current has a first polarity; and if the selected terminal is the second terminal of the primary coil, then the primary current has a second polarity that is opposite the first polarity.

2. The device of claim 1, wherein the balancing current is for charging the cell.

3. The device of claim 1, wherein the cell is a first cell, the at least one signal includes at least one first signal, and the balancing current is a first balancing current, and wherein:
the controller is for: receiving an indication of a metric of a second cell of the battery; and, in response thereto, outputting at least one second signal to select a polarity of a second balancing current for balancing the second cell;
the at least one polarity switch is coupled between the transformer and the controller for: receiving the at least one second signal from the controller; and, in response thereto, causing the transformer to generate the primary current through the primary coil; and
the transformer is for: generating the second balancing current through the secondary coil by inductively coupling the primary coil to the secondary coil; and outputting the second balancing current having the selected polarity for balancing the second cell.

4. The device of claim 2, wherein the selected polarity of the balancing current is the first polarity.

5. The device of claim 1, wherein the balancing current is for discharging the cell, and the selected polarity of the balancing current is the second polarity.

6. The device of claim 1, wherein the controller is for outputting the at least one signal to close first and second switches that are coupled between the secondary coil and respective first and second terminals of the cell.

7. The device of claim 6, wherein the at least one polarity switch is coupled between the transformer and the controller for: receiving the at least one signal from the controller; and, in response thereto, selectively coupling the received current to the selected terminal of the primary coil for causing the transformer to generate the primary current through the primary coil during a time in which the first and second switches are closed.

8. The device of claim 3, comprising: a first switch for selectively coupling the first balancing current from a first terminal of the secondary coil to a positive terminal of the first cell; and a second switch for selectively coupling the first balancing current from a negative terminal of the first cell to a second terminal of the secondary coil and for selectively coupling the second balancing current from the second terminal of the secondary coil to a positive terminal of the second cell; and a third switch for selectively coupling the second balancing current from a negative terminal of the second cell to the first terminal of the secondary coil.

9. The device of claim 8, wherein the controller includes: a primary controller; and a secondary controller for selectively closing selected pairs of the first, second and third switches in response to an indication from the primary controller.

10. The device of claim 9, wherein the primary controller and the secondary controller are formed on separate substrates.

11. A device comprising:
an energy-storage device including at least first and second energy-storage units that are coupled in series to generate respective energy-storage unit voltages, wherein the energy-storage device is coupled to output a total of the respective energy-storage unit voltages from a power terminal of the energy-storage device;
a polarity controller for selectively coupling a current received from the power terminal to a selected terminal of a primary coil, wherein: the selected terminal is one of a first terminal and a second terminal of the primary coil; and a primary current in the primary coil has a polarity in accordance with the selected terminal;
a transformer including the primary coil and a secondary coil, wherein the transformer is for generating a secondary current in the secondary coil by inductively coupling the primary coil to the secondary coil, so the secondary current has a polarity in response to the polarity of the primary current; and
a switch matrix for selectively coupling the secondary current to a conditioning terminal of a selected one of the first and second energy-storage units;
wherein: if the selected terminal is the first terminal of the primary coil, then the primary current has a first polarity; and if the selected terminal is the second terminal of the primary coil, then the primary current has a second polarity that is opposite the first polarity.

12. The device of claim 11, wherein: the transformer is for stepping down a received voltage associated with the current received from the power terminal to a voltage level in the secondary coil for conditioning the selected energy-storage unit.

13. The device of claim 12, wherein: the transformer is for stepping down the received voltage in accordance with a step-down ratio determined in accordance with the total of the respective energy-storage unit voltages.

14. The device of claim 11, wherein: the secondary coil is coupled to charge the selected energy-storage unit if the secondary current has the first polarity.

15. The device of claim 14, wherein: the secondary coil is coupled to discharge the selected energy-storage unit if the secondary current has the second polarity.

16. The device of claim 11, wherein: the conditioning terminal is a first conditioning terminal; the switch matrix is for selectively coupling the secondary current from a first tap of the secondary coil to the first conditioning terminal of the selected energy-storage unit; the switch matrix is for selectively coupling the secondary current from a second conditioning terminal of the selected energy-storage unit to a second tap of the secondary coil; and the secondary current simultaneously flows through no more than two switches for coupling the secondary current through the selected energy-storage unit.

17. A method, comprising:
generating respective energy-storage unit voltages from at least first and second energy-storage units of an energy-storage device, wherein the first and second energy-storage units are coupled in series, and outputting a total of the respective energy-storage unit voltages from a power terminal of the energy-storage device;
selectively coupling a current received from the power terminal to a selected terminal of a primary coil of a transformer, wherein: the selected terminal is one of a first terminal and a second terminal of the primary coil; and a primary current in the primary coil has a polarity in accordance with the selected terminal;
generating a secondary current in a secondary coil of the transformer by inductively coupling the primary coil to the secondary coil, so the secondary current has a polarity in response to the polarity of the primary current; and
selectively coupling the secondary current to a conditioning terminal of a selected one of the first and second energy-storage units;
wherein: if the selected terminal is the first terminal of the primary coil, then the primary current has a first polarity; and if the selected terminal is the second terminal of the primary coil, then the primary current has a second polarity that is opposite the first polarity.

18. The method of claim 17, comprising: balancing the energy-storage unit voltage of the selected energy-storage unit by repeatedly selectively coupling the current received from the power terminal to the selected terminal of the primary coil.

19. The method of claim 18, comprising:
generating an indication of a metric of the selected energy-storage unit in response a measurement of the energy-storage unit voltage of the selected energy-storage unit; and
selecting the selected terminal of the primary coil in response to the indication of the metric of the selected energy-storage unit.

* * * * *